United States Patent
Cervin et al.

(10) Patent No.: US 10,770,540 B2
(45) Date of Patent: Sep. 8, 2020

(54) SMALL-GAP COPLANAR TUNABLE CAPACITORS AND METHODS FOR MANUFACTURING THEREOF

(71) Applicant: NXP USA, Inc., Austin, TX (US)

(72) Inventors: Andrew Vladimir Claude Cervin, Oakville (CA); Marina Zelner, Burlington (CA)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/672,151

(22) Filed: Nov. 1, 2019

(65) Prior Publication Data

US 2020/0066836 A1 Feb. 27, 2020

Related U.S. Application Data

(62) Division of application No. 15/791,177, filed on Oct. 23, 2017, now Pat. No. 10,497,774.

(51) Int. Cl.
*H01L 49/02* (2006.01)
*H01G 7/06* (2006.01)
(Continued)

(52) U.S. Cl.
CPC .......... *H01L 28/60* (2013.01); *H01G 4/1227* (2013.01); *H01G 4/33* (2013.01); *H01G 7/06* (2013.01);
(Continued)

(58) Field of Classification Search
CPC ................................ H01L 28/60; H01L 28/92
See application file for complete search history.

(56) References Cited

U.S. PATENT DOCUMENTS 5,745,335 A 4/1998 Watt
5,959,516 A 9/1999 Chang et al.
(Continued)

FOREIGN PATENT DOCUMENTS

CA 2219945 A1 2/1997
CA 2419137 A1 3/2002
(Continued)

OTHER PUBLICATIONS

Extended European Search Report 18202149.3, dated Apr. 9, 2019, pp. 1-7.
(Continued)

*Primary Examiner* — Lex H Malsawma
*Assistant Examiner* — Xia L Cross

(57) ABSTRACT

A coplanar capacitor that incorporates teachings of the subject disclosure may include: a substrate; a voltage-tunable dielectric layer over the substrate; a plurality of bias lines over the voltage-tunable dielectric layer (wherein the bias lines are covered by an inter-level dielectric); a plurality of sidewall spacers (wherein each of the sidewall spacers is located adjacent one of the bias lines and each of the sidewall spacers spans between a respective portion of the voltage-tunable dielectric layer and a respective portion of the inter-level dielectric); and an electrode over the inter-level dielectric, and over portions of the voltage-tunable dielectric layer that are not covered by the plurality of bias lines and that are not covered by the sidewall spacers, wherein a plurality of gaps are disposed in the electrode. Other embodiments are disclosed.

20 Claims, 15 Drawing Sheets

(51) Int. Cl.

| | | |
|---|---|---|
| *H01L 23/522* | (2006.01) | |
| *H01L 21/283* | (2006.01) | |
| *H01L 21/311* | (2006.01) | |
| *H01L 21/3213* | (2006.01) | |
| *H01L 23/528* | (2006.01) | |
| *H01G 4/33* | (2006.01) | |
| *H01G 4/12* | (2006.01) | |

(52) U.S. Cl.
CPC ...... *H01L 21/283* (2013.01); *H01L 21/31111* (2013.01); *H01L 21/32133* (2013.01); *H01L 23/528* (2013.01); *H01L 23/5223* (2013.01); *H01L 28/55* (2013.01); *H01L 28/56* (2013.01); *H01L 28/75* (2013.01); *H01L 28/92* (2013.01); *H01G 4/1236* (2013.01); *H01G 4/1254* (2013.01)

(56) References Cited

U.S. PATENT DOCUMENTS

| | | |
|---|---|---|
| 6,066,536 A | 5/2000 | Lin et al. |
| 6,207,522 B1 | 3/2001 | Hunt et al. |
| 6,229,684 B1 | 5/2001 | Cowen et al. |
| 6,347,237 B1 | 2/2002 | Eden et al. |
| 6,490,147 B2 | 12/2002 | Yoon et al. |
| 6,556,415 B1 | 4/2003 | Lee et al. |
| 6,573,587 B1 | 6/2003 | Igarashi |
| 6,590,473 B1 | 7/2003 | Seo et al. |
| 6,600,644 B1 | 7/2003 | Chiou et al. |
| 6,633,260 B2 | 10/2003 | Paschen et al. |
| 6,744,335 B2 | 6/2004 | Ryhänen et al. |
| 6,800,912 B2 | 10/2004 | Ozgur et al. |
| 6,815,739 B2 | 11/2004 | Huff et al. |
| 6,876,056 B2 | 4/2005 | Tilmans et al. |
| 6,906,905 B1 | 6/2005 | Chinthakindi et al. |
| 6,922,327 B2 | 7/2005 | Chua et al. |
| 6,954,348 B1 | 10/2005 | Rodgers et al. |
| 6,970,055 B2 | 11/2005 | Toncich et al. |
| 6,992,878 B2 | 1/2006 | Shimanouchi et al. |
| 7,030,463 B1 | 4/2006 | Subramanyam et al. |
| 7,085,122 B2 | 8/2006 | Wu et al. |
| 7,224,040 B2 | 5/2007 | Koutsaroff et al. |
| 7,265,019 B2 | 9/2007 | Chinthakindi et al. |
| 7,738,237 B2 | 6/2010 | Lee |
| 7,749,792 B2 | 7/2010 | Fedder et al. |
| 7,858,423 B2 | 12/2010 | Siamak et al. |
| 7,869,187 B2 | 1/2011 | McKinzie et al. |
| 8,072,272 B2 | 12/2011 | Zhao et al. |
| 8,154,850 B2 | 4/2012 | Zelner et al. |
| 8,194,386 B2 | 6/2012 | Steeneken et al. |
| 8,424,176 B2 | 4/2013 | Smith et al. |
| 8,569,142 B2 | 10/2013 | Patel et al. |
| 8,664,704 B2 | 3/2014 | Cervin et al. |
| 8,693,162 B2 | 4/2014 | Capanu et al. |
| 9,269,496 B2 | 2/2016 | Oakes |
| 9,438,196 B2 | 9/2016 | Smith |
| 9,773,781 B1* | 9/2017 | Zang ............... H01L 27/0629 |
| 2003/0011002 A1* | 1/2003 | Takaura ........... H01L 21/76895 |
| | | 257/200 |
| 2003/0104649 A1 | 6/2003 | Ozgur et al. |
| 2005/0117439 A1 | 6/2005 | Kijima |
| 2005/0227428 A1 | 10/2005 | Mihai et al. |
| 2006/0263974 A1* | 11/2006 | Busch ................ B82Y 10/00 |
| | | 438/239 |
| 2007/0007853 A1 | 1/2007 | Toit et al. |
| 2007/0132065 A1 | 6/2007 | Lee et al. |
| 2009/0275187 A1* | 11/2009 | Kiehlbauch ....... H01L 27/10852 |
| | | 438/399 |
| 2010/0182730 A1 | 7/2010 | Beelen et al. |
| 2010/0182731 A1 | 7/2010 | Steeneken et al. |
| 2013/0342285 A1 | 12/2013 | Kadota et al. |
| 2014/0216921 A1 | 8/2014 | Zelner et al. |
| 2016/0268048 A1 | 9/2016 | Zelner |
| 2019/0080851 A1 | 3/2019 | Nies et al. |
| 2019/0122826 A1 | 4/2019 | Zelner et al. |
| 2019/0123131 A1 | 4/2019 | Cervin et al. |
| 2019/0272956 A1 | 9/2019 | Zelner et al. |

FOREIGN PATENT DOCUMENTS

| | | |
|---|---|---|
| CA | 2422007 A1 | 3/2002 |
| CA | 2422040 A1 | 3/2002 |
| EP | 0837504 A2 | 4/1998 |
| EP | 1682444 A2 | 7/2006 |
| EP | 1717830 B1 | 6/2010 |
| EP | 2096650 A4 | 12/2013 |
| EP | 2768072 A1 | 8/2014 |
| EP | 1836712 B1 | 10/2014 |
| WO | 0184660 A1 | 11/2001 |
| WO | 02084684 A2 | 10/2002 |
| WO | 2005001863 A1 | 1/2005 |
| WO | 2008050271 A2 | 5/2008 |
| WO | 2017099737 A1 | 6/2017 |

OTHER PUBLICATIONS

Extended European search report, 18202148.5, dated Apr. 9, 2019, 9 pages.

Arif, Muhammad S. et al., "All-Silicon Technology for High-Q Evanescent Mode Cavity Tunable Resonators and Filters", Microelectromechanical Systems 23.3, 2014, 727-739.

Chang, "Design, optimization and fabrication of amorphous silicon tunable RF MEMS inductors and transformers", A thesis presented to the University of Waterloo in fulfillment of the thesis requirement for the degree of Doctor of Philosophy in Electrical and Computer Engineering, 2006, 1-178.

Chen, et al., "Design and modeling of a micromachined high-Q tunable capacitor with large tuning range and a vertical planar spiral inductor", IEEE Transactions on Electron Devices 50.3, Apr. 2003, 730-739.

Fritschi, Raphael, "Above-IC RF MEMS devices for communication applications", 2007.

Mesgar, Alireza H., "Design, fabrication and characterization of RF MEMS inductors and switches", Diss. Concordia University, 2006.

Oberhammer, J. et al., "Monocrystalline-Silicon Microwave MEMS", PIERS Progress in Electromagnetics Research Symposium, Stockholm, Sweden, Aug. 12-15 2013. The Electromagnetics Academy, 2013, pp. 1-7.

Vega, Reinaldo, "Advanced source/drain and contact design for nanoscale CMOS", University of California, Berkeley, 2010.

Yeh, J. A. et al., "Microwave characteristics of liquid-crystal tunable capacitors", IEEE Electron Device Letters 26.7, 2005, 451-453.

Yoon, Yong-Kyu et al., "A Reduced Intermodulation Distortion Tunable Ferroelectric Capacitor: Architecture and Demonstration", School of Electrical and Computer Engineering, Georgia Institute of Technology, Atlanta, GA 30332, USA, 2003, 4 pages.

Zou, Jun et al., "Micromachined inductors and capacitors", Grainger Center for Electric Machinery and Electromechanics. Technical Report., Mar. 2003, 1-31.

* cited by examiner

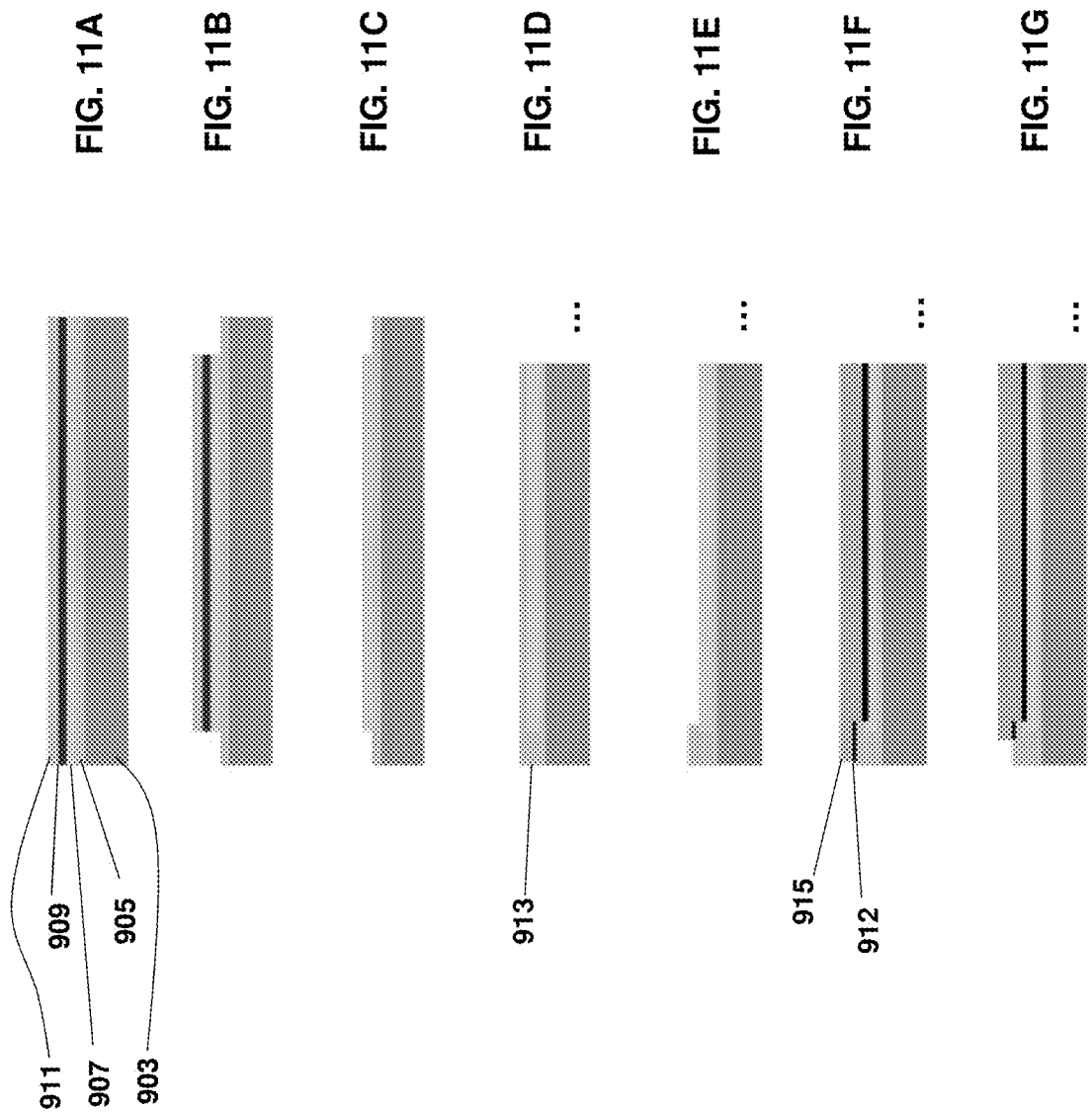

SMALL-GAP COPLANAR TUNABLE CAPACITORS AND METHODS FOR MANUFACTURING THEREOF

CROSS-REFERENCE TO RELATED APPLICATION(S)

This application is a divisional of U.S. patent application Ser. No. 15/791,177, filed Oct. 23, 2017. All sections of the aforementioned application(s) and/or patent(s) are incorporated herein by reference in their entirety.

The subject disclosure relates to U.S. patent application Ser. No. 15/791,176, filed Oct. 23, 2017 (now U.S. Pat. No. 10,332,687), entitled TUNABLE COPLANAR CAPACITOR WITH VERTICAL TUNING AND LATERAL RF PATH AND METHODS FOR MANUFACTURING THEREOF, in the name of Marina Zelner, et al., the disclosure of which is hereby incorporated by reference.

FIELD OF THE DISCLOSURE

The subject disclosure relates, in general, to coplanar tunable capacitors and, more particularly, to small-gap coplanar tunable capacitors and methods for manufacturing thereof.

BACKGROUND

Tunable capacitors have various uses in RF systems including as voltage-tunable devices. Some benefits of tunable capacitors are integration of different values and functions of capacitance. Applications for tunable capacitors can include tunable filters, voltage controlled oscillators, tunable phase shifters, tunable matching networks, low-impedance power supplies, decoupling high-frequency signals at an IC bonding pad, or others.

Integrated circuits including tunable capacitors can, for example, be used in portable electronics for low-power wireless communication (e.g., cellular phones, pagers, PDAs, and so forth), directional antenna systems, high clock-rate microphones, miniature DC to DC converters, or other devices.

BRIEF DESCRIPTION OF THE DRAWINGS

Reference will now be made to the accompanying drawings, which are not necessarily drawn to scale, and wherein:

FIGS. 11A-11G depict an illustrative embodiment of various steps in the manufacturing of a coplanar capacitor (these views provide cross-sections through the RF electrode and these views correspond to respective views of FIGS. 9A-9G);

DETAILED DESCRIPTION

Figure 1:
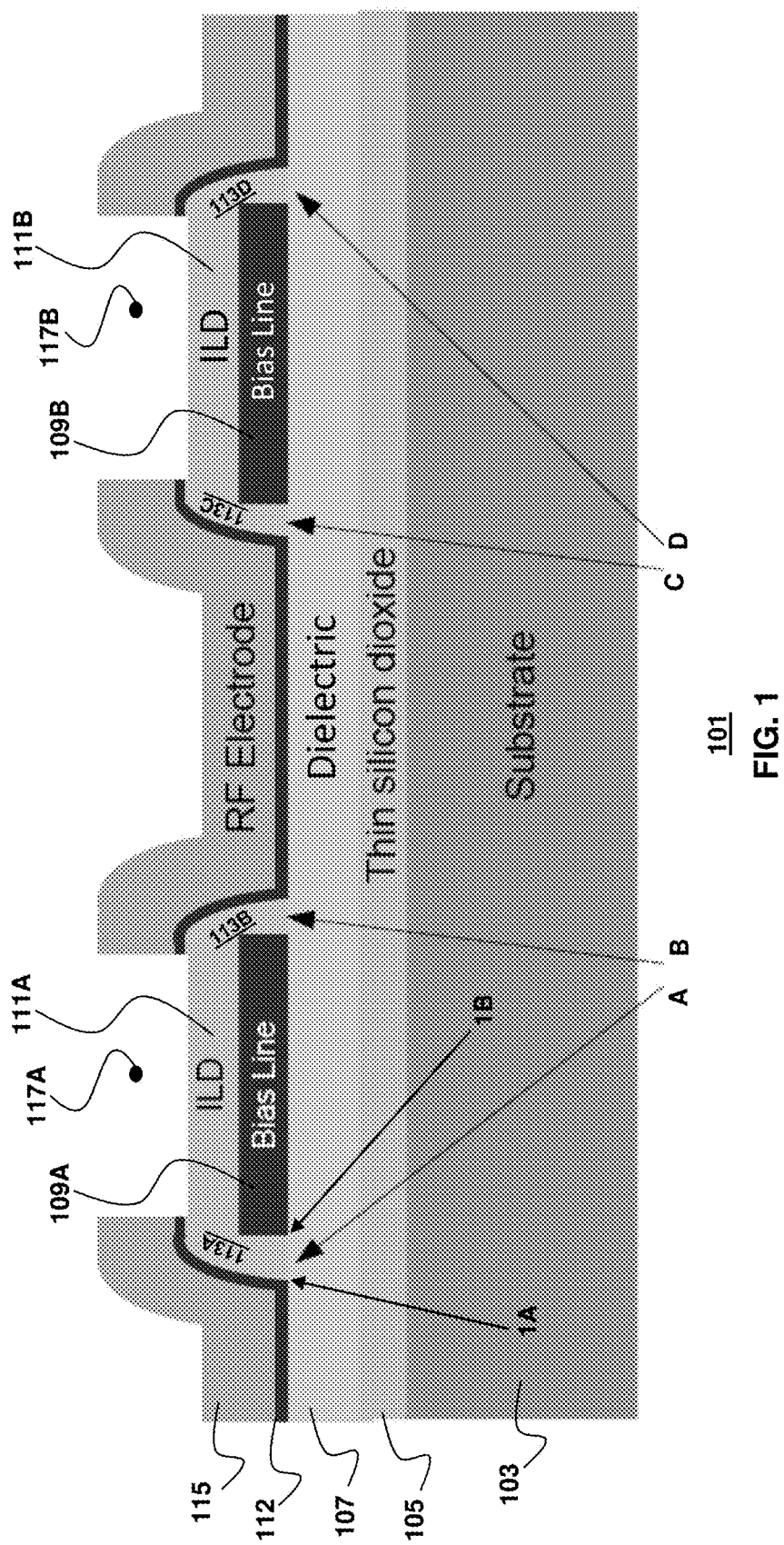
FIG. 1 depicts an illustrative embodiment of a coplanar capacitor (this view provides a cross-sectional diagram across the capacitor stripes—in various embodiments, a capacitor is formed along the edges of bias lines; in order to improve the linearity and power handling of the device many of these capacitors can be connected in series, leading to a number of long thin bias lines that are sometimes referred to herein as stripes)

The subject disclosure describes, among other things, illustrative embodiments of coplanar tunable capacitors and methods for manufacturing thereof. Other embodiments are described by the subject disclosure.

One embodiment of the subject disclosure includes a coplanar capacitor, comprising: a substrate; a voltage-tunable dielectric layer over the substrate; a plurality of bias lines over the voltage-tunable dielectric layer, wherein each of the plurality of bias lines includes vertical sidewalls, and wherein the plurality of bias lines are covered by an inter-level dielectric; a plurality of sidewall spacers, each of the plurality of sidewall spacers being located adjacent to and in intimate contact with a respective vertical sidewall of one of the plurality of bias lines and the inter-level dielectric; and a metal electrode over the inter-level dielectric, and over portions of the voltage-tunable dielectric layer that are not covered by the plurality of bias lines and that are not covered by the sidewall spacers, wherein a plurality of gaps are etched in the metal electrode to insulate and separate portions of metal electrode over the voltage-tunable dielectric layer from each other but still completely cover the exposed portions of the voltage-tunable dielectric layer.

Another embodiment of the subject disclosure includes a coplanar capacitor, comprising: a first dielectric layer, wherein the first dielectric layer is disposed on a substrate, wherein the substrate includes a silicon dioxide layer upon which the first dielectric layer is disposed, and wherein the first dielectric layer comprises a voltage-tunable dielectric; a plurality of bias lines, wherein each of the plurality of bias lines includes vertical sidewalls, and wherein the plurality of bias lines are disposed on the voltage-tunable dielectric layer, and wherein the plurality of bias lines comprise metal; an inter-level dielectric, wherein the inter-level dielectric is disposed on the plurality of bias lines; a plurality of sidewall spacers, wherein each of the plurality of sidewall spacers is located adjacent to and in intimate contact with a respective vertical sidewall of one of the plurality of bias lines; and a metal electrode layer, wherein the electrode layer is disposed on portions of the voltage-tunable dielectric layer that are not covered by the plurality of bias lines and that are not covered by the sidewall spacers, wherein the electrode layer is disposed on the plurality of sidewall spacers, wherein a plurality of gaps are etched in the electrode layer to insulate and separate portions of metal electrode over the voltage-tunable dielectric layer from each other but still completely cover the exposed portions of the voltage-tunable dielectric layer.

Another embodiment of the subject disclosure includes a method for fabricating a coplanar capacitor, the method comprising: depositing a voltage-tunable dielectric layer on a substrate; depositing a metal layer on the voltage-tunable dielectric layer; depositing an inter-level dielectric layer on the metal layer; etching material from the inter-level dielectric layer and from the metal layer to form a plurality of bias lines covered at least partially by respective portions of the inter-level dielectric layer, wherein each of the plurality of bias lines includes vertical sidewalls; depositing an oxide layer on exposed surface portions of the inter-level dielectric layer and on exposed surface portions of the voltage-tunable dielectric layer, wherein the oxide layer that is deposited includes upright portions between the inter-level dielectric layer and the voltage-tunable dielectric layer; etching material from the oxide layer to expose portions of the inter-level dielectric layer, to expose portions of the voltage-tunable dielectric layer and to form, from the upright portions, a plurality of sidewall spacers, wherein each of the plurality of sidewall spacers is located adjacent to and in intimate contact with a respective vertical sidewall of one of the plurality of bias lines, and wherein the etching of the material from the oxide layer results in exposed portions of the inter-level dielectric layer and exposed portions of the voltage-tunable dielectric layer; depositing a metal electrode layer on the exposed portions of the inter-level dielectric layer and on the exposed portions of the voltage-tunable dielectric layer; and etching material from the electrode layer to form a plurality of gaps, wherein the gaps insulate and separate portions of metal electrode layer over the voltage-tunable dielectric layer from each other but still allow the metal electrode layer to completely cover the exposed portions of the voltage-tunable dielectric layer.

Another embodiment of the subject disclosure includes a method for fabricating a coplanar capacitor, the method comprising: depositing a first dielectric layer, wherein the first dielectric layer is deposited on a substrate including a silicon dioxide layer; depositing a first metal layer, wherein the first metal layer is deposited on the first dielectric layer; depositing a second dielectric layer, wherein the second dielectric layer is deposited on the first metal layer; forming a plurality of bias lines by etching material from the second dielectric layer and from the first metal layer, wherein the plurality of bias lines are covered at least partially by respective portions of the second dielectric layer, and wherein each of the plurality of bias lines includes vertical sidewalls, and; depositing an oxide layer, wherein some of the oxide layer is deposited on exposed surface portions of the second dielectric layer, wherein some the oxide layer is deposited on exposed surface portions of the first dielectric layer, and wherein some of the oxide layer forms upright portions between the second dielectric layer and the first dielectric layer; exposing, via etching of material from the oxide layer, portions of the second dielectric layer and portions of the first dielectric layer, wherein the etching forms, from the upright portions, a plurality of sidewall spacers, wherein each of the plurality of sidewall spacers is located adjacent to and in intimate contact with a respective vertical sidewall of one of the plurality of bias lines, and wherein the etching of the material from the oxide layer results in exposed portions of the second dielectric layer and exposed portions of the first dielectric layer; depositing a metal electrode layer, wherein the metal electrode layer is deposited on the exposed portions of the second dielectric layer and on the exposed portions of the first dielectric layer; and etching material from the metal electrode layer to form a plurality of gaps, wherein the gaps insulate and separate portions of metal electrode layer over the voltage-tunable dielectric layer from each other but still allow the metal electrode layer to completely cover the exposed portions of the voltage-tunable dielectric layer.

Referring now to FIG. 1, a coplanar tunable capacitor device 101 according to an embodiment is shown (this FIG. 1 shows the device 101 in cross section). Device 101 comprises substrate 103 (including thin silicon dioxide layer 105). A voltage-tunable dielectric layer 107 is disposed over the substrate, on the thin silicon dioxide layer (in another embodiment, the voltage-tunable dielectric layer can be disposed directly on the substrate (without the thin silicon dioxide layer being disposed between the two)). In another specific example, the voltage-tunable material can have a dielectric constant that can be varied by application of a voltage. A plurality of bias lines 109A, 109B are disposed over the voltage-tunable dielectric layer (while two bias lines are shown in this view, it is to be understood that any desired number of bias lines may be utilized). Further, the plurality of bias lines are covered by respective portions 111A, 111B of an inter-level dielectric. In other examples, the voltage-tunable material can comprise one or more of a high-K ferroelectric material, such as (but not limited to) barium strontium titanate (BST), lead zirconate titanate (PZT), lead lanthanum zirconate titanate (PLZT), strontium bismuth tantalate (SBT), lithium niobate (LN), bismuth lanthanum titanate (BLT), and lead scandium titanate including doped compositions or solid solutions thereof. In order to achieve desired properties, such material can be a layered structure comprising one or more tunable dielectrics.

Still referring to FIG. 1, a plurality of sidewall spacers 113A, 113B, 113C and 113D are provided. Each of the plurality of sidewall spacers is located adjacent one of the plurality of bias lines and each of the plurality of sidewall spacers spans between a respective portion of the voltage-tunable dielectric layer and a respective portion of the inter-level dielectric. Further, an electrode 115 (e.g., an RF electrode) is provided over the inter-level dielectric (ILD), and over portions of the voltage-tunable dielectric layer that are not covered by the plurality of bias lines and that are not covered by the sidewall spacers. In one specific example, electrode 115 can include layer 112 (e.g. a thin platinum layer). A plurality of gaps 117A, 117B are disposed in the electrode, wherein each of the plurality of gaps is located at a location above a respective one of the plurality of bias lines.

Still referring to FIG. 1, in one specific example, a left-right dimension (see, e.g., the horizontal distance between points 1A and 1B in this view) of a sidewall spacer can be about 2,000-3,000 angstroms (inclusive). It is these sidewall spacer lateral dimensions that are sub-micron and that define the dielectric thickness of the capacitor. A left-right dimension in this range can be provided as described herein without use of submicron lithography. In another specific example, a signal (e.g., an RF signal) can be injected at the left side of device 101 and propagate to the right side of the device 101 and/or a signal (e.g., an RF signal) can be injected at the right side of device 101 and propagate to the left side of the device 101. In another specific example, a width of the gap 117A (and/or of gap 117B) can impact the Q factor for device 101. In another specific example, a positive voltage can be applied at bias line 109A (and/or at bias line 109B) and the electrode 115 can be biased to DC ground. In another specific example, a sidewall configuration disclosed herein can reduce electrostrictive resonance (for example, electrostrictive resonance effects can be reduced because such waves would move laterally without encountering interfaces that can reflect and cause losses in the device at specific frequency). In another specific example, a sidewall configuration disclosed herein can be used to define a tunable capacitor on top of a barium strontium titanate (BST) layer (in this regard, see "A", "B" "C" and "D" of FIG. 1 showing tunable lateral capacitor areas (coplanar) under sidewall spacers). In another specific example, the sidewalls can reduce the tuning voltage of the coplanar capacitor (e.g., reducing the tuning voltage from approximately 200V to approximately 24V, depending on the width of the sidewall spacers).

Figure 2:
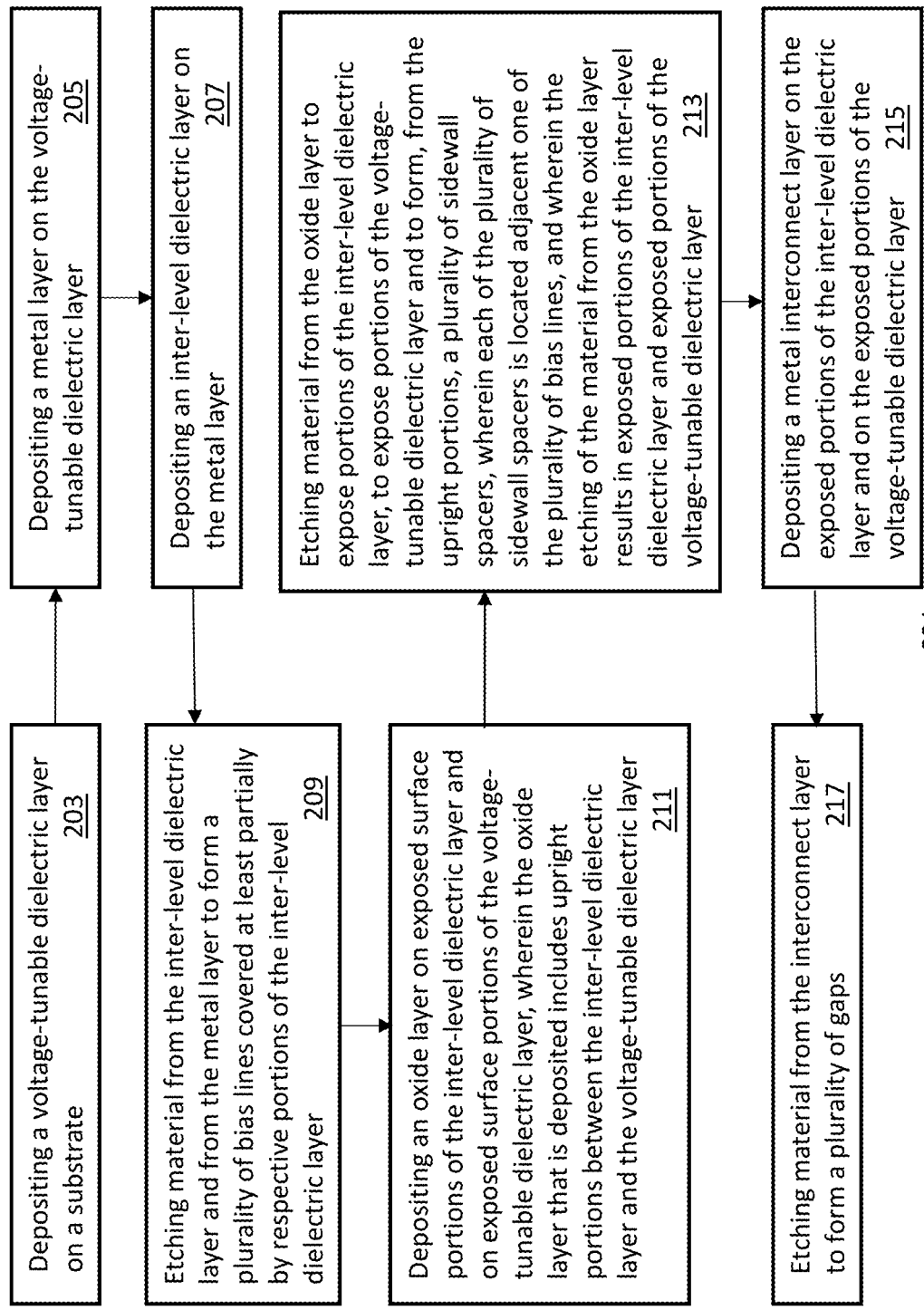
FIG. 2 depicts an illustrative embodiment of a method that can be used for manufacturing of a coplanar capacitor.

Referring now to FIG. 2, various steps of a method 201 (for fabricating a coplanar capacitor) according to an embodiment are shown. As seen in this FIG. 2, step 203 comprises depositing a voltage-tunable dielectric layer on a substrate. Next, step 205 comprises depositing a metal layer on the voltage-tunable dielectric layer. Next, step 207 comprises depositing an inter-level dielectric layer on the metal layer. Next, step 209 comprises etching material from the inter-level dielectric layer and from the metal layer to form a plurality of bias lines covered at least partially by respective portions of the inter-level dielectric layer (in one specific example, the etch gives vertical or near-vertical sidewalls on the inter-level dielectric and the metal bias lines). Next, step 211 comprises depositing a conformal oxide layer on the whole surface. This conformal oxide layer has a lateral thickness (of the deposited oxide layer) on the vertical sidewalls of the etched inter-level dielectric and the etched metal bias line substantially the same as the vertical thickness (of the deposited oxide layer) on the horizontal surfaces of the inter-level dielectric and the voltage-tunable dielectric. Next, step 213 comprises etching (anisotropically etching) material from the oxide layer to expose portions of the inter-level dielectric layer, to expose portions of the voltage-tunable dielectric layer and to form, from the upright portions, a plurality of sidewall spacers, wherein each of the plurality of sidewall spacers is located adjacent one of the plurality of bias lines, and wherein the etching of the material from the oxide layer results in exposed portions of the inter-level dielectric layer and exposed portions of the voltage-tunable dielectric layer. The etching of this step forms an insulating layer (e.g., the sidewall spacers) of well-defined thickness from the deposited oxide on each vertical sidewall of the inter-level dielectric layer and metal layer. Next, step 215 comprises depositing a metal interconnect layer on the exposed portions of the inter-level dielectric layer and on the exposed the portions of the voltage-tunable dielectric layer. Next, step 217 comprises etching material from the interconnect layer to form a plurality of gaps.

Still referring to FIG. 2, in one specific example, the interconnect layer (see step 215) can be deposited over the portions of the inter-level dielectric layer by being deposited on portions of the oxide layer that remain above the inter-level dielectric layer. In another specific example, the etching the material from the oxide layer (see step 213) can comprise performing anisotropic etching. In another specific example, the anisotropic etching can be in a direction perpendicular to the substrate.

Figure 3:
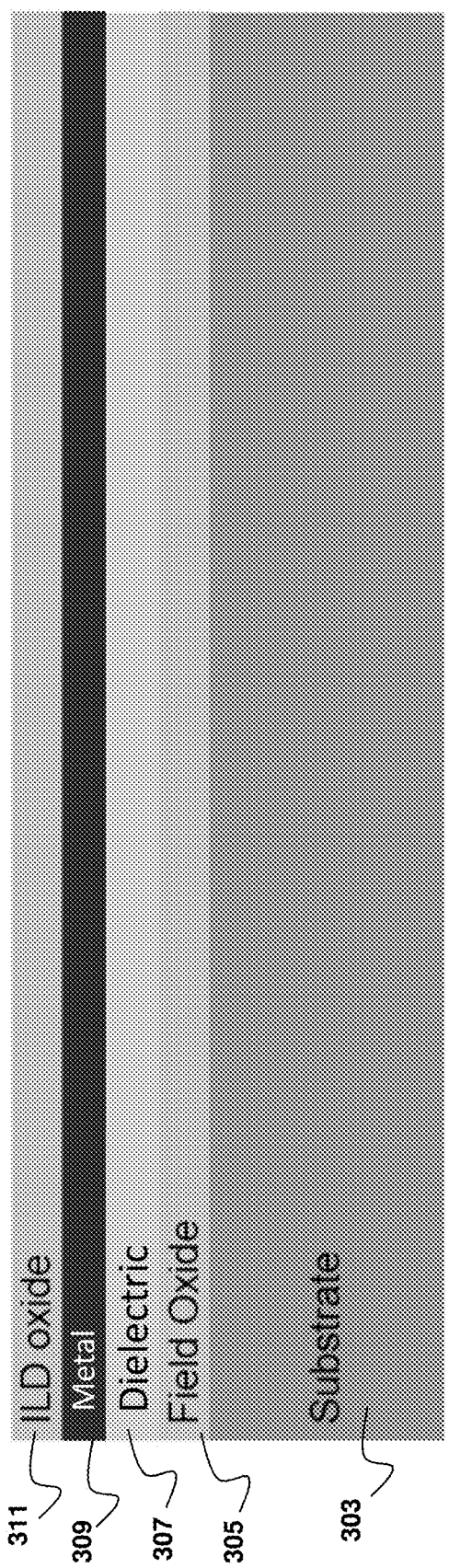
FIGS. 3-8 depict an illustrative embodiment of various steps in the manufacturing of a coplanar capacitor (these views provide cross-sectional diagrams across the capacitor stripes)

Referring now to FIGS. 3-8, depicted is an illustrative embodiment of various steps in the manufacturing of a coplanar capacitor (in FIGS. 3-8, each call out number refers to the same respective component (as modified throughout the process) that is shown in each of the figures of this series). More particularly, FIG. 3 depicts the results of: (a) substrate preparation (see substrate 303 (which can include thereon a field oxide layer 305); (b) voltage-tunable dielectric deposition (see dielectric 307); (c) platinum (Pt) deposition (see metal 309); (d) ILD oxide deposition (see ILD oxide 311). In one specific example, the voltage-tunable dielectric can also be patterned. In another specific example, the voltage-tunable dielectric can be doped BST. In another specific example, the voltage-tunable dielectric can be sputtered. In another specific example, the voltage-tunable dielectric can be annealed.

Figure 4:
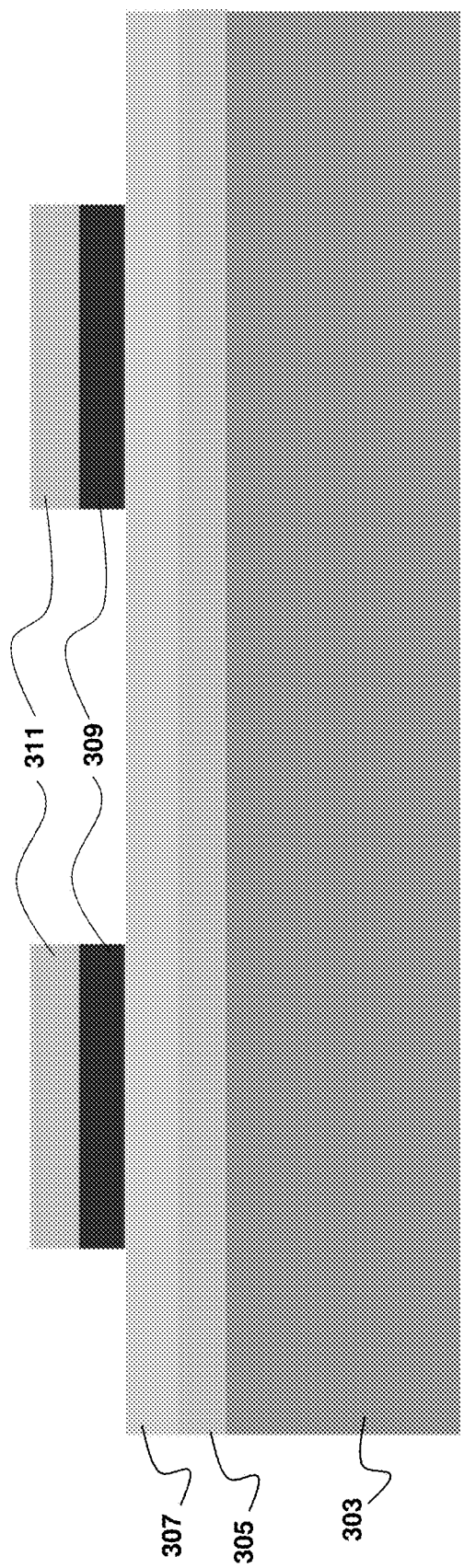

Further, FIG. 4 depicts the results of: (a) bias line platinum pattern (see 309 formed by etching out sections of platinum); followed by (b) a high-temperature anneal to repair the voltage-tunable dielectric. In one specific example, the bias line "width" (as shown left-right in this view) should be minimized (i.e., made as small as possible). In another specific example, the bias line "width" can impact the capacitance. In another specific example, the bias line "length" (that is, into the page in this view) can impact the capacitance. In another specific example, the number of bias lines can impact the capacitance.

Figure 5:
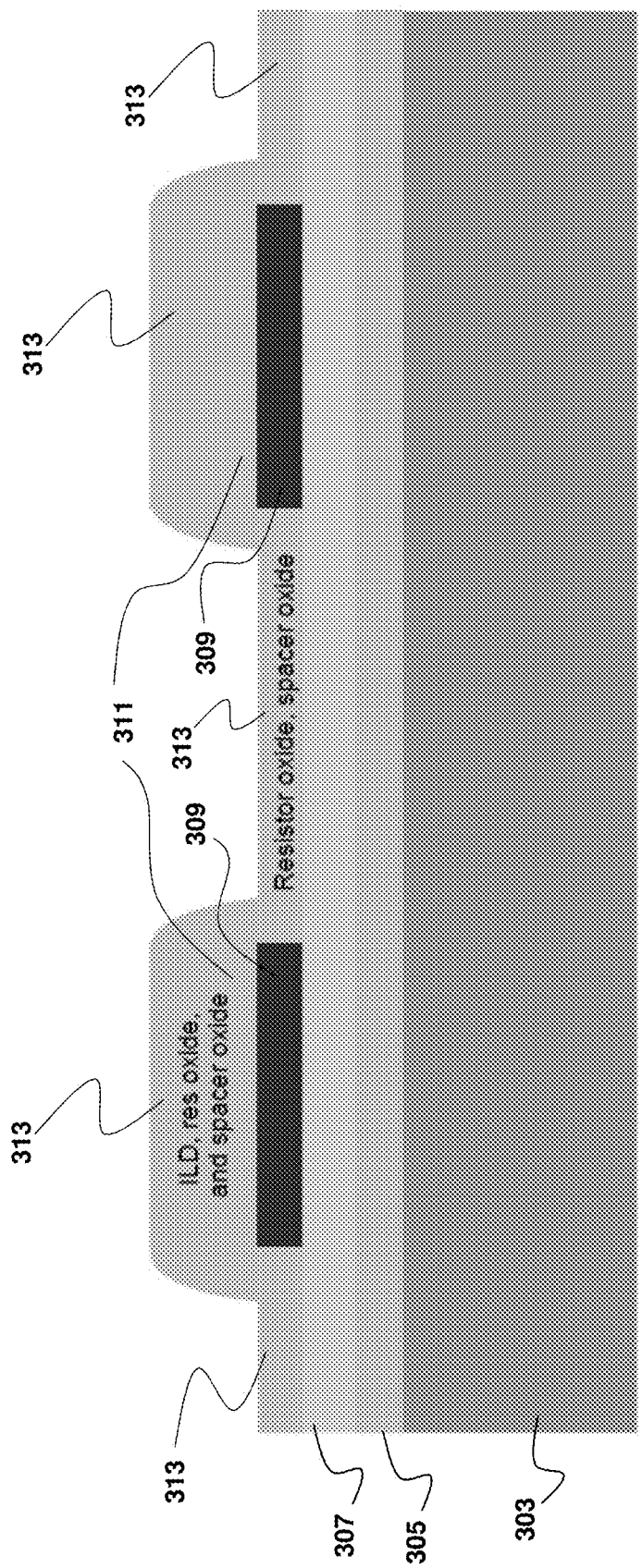

Further, FIG. 5 (related to sidewall spacer and resistor formation) depicts the results of: (a) resistor oxide deposition (see 313); (b) SiCr process; and (c) spacer oxide deposition (see 313). In one specific example, conformal deposition of the resistor oxide and the spacer oxide to the outer surfaces of the platinum (309) facilitates the production of sidewall spacers (see 314A, 314B, 314C and 314D of FIG. 6) that are conformal. In one specific example, the term conformal can include "mirroring" a surface. In another specific example, each sidewall can have the same longitudinal thickness at a given height. In another specific example, the resistor oxide deposition and the spacer oxide deposition could be the same process but the SiCr processing sequence could go as follows: (1) resistor oxide deposition (conformal); (2) SiCr deposition; (3) SiCr patterning/etch; (4) SiCr anneal (for final resistance); (5) spacer oxide deposition (conformal). In another specific example, the resistors are patterned to leave the resistor patterns separated from the active area of the device.

Figure 6:
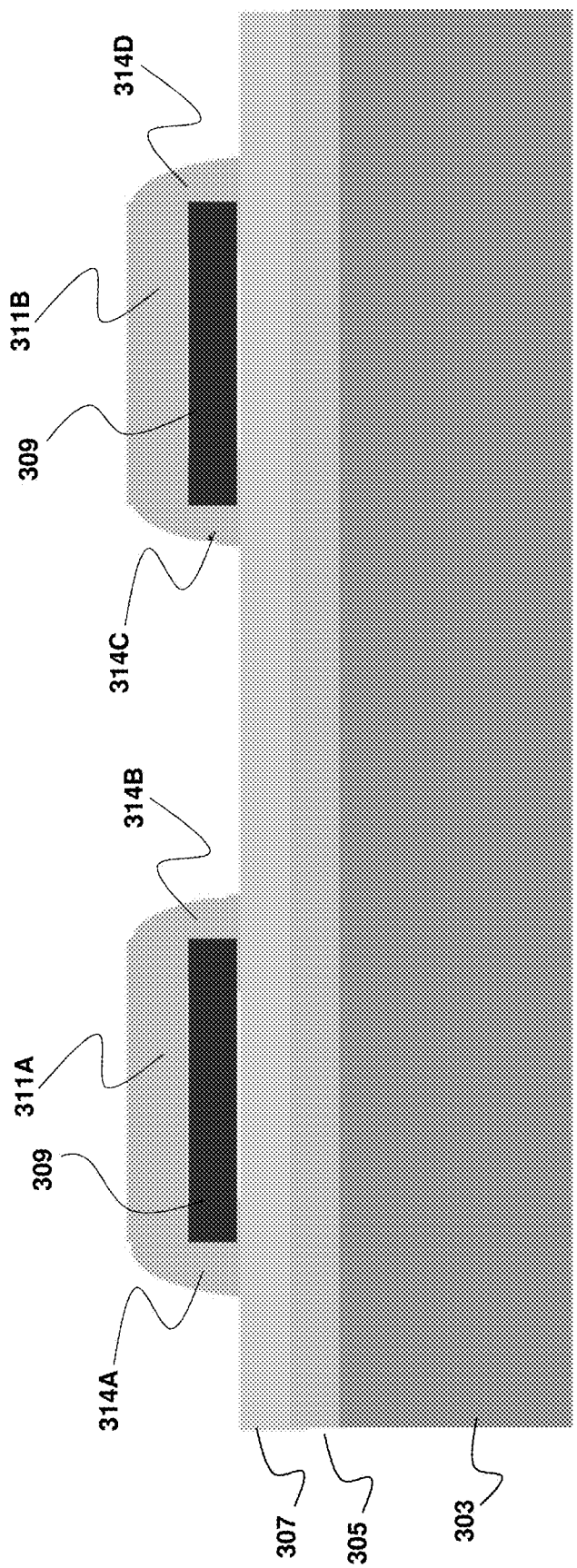

Further, FIG. 6 (related to sidewall spacer and resistor formation) depicts the results of: (a) resistor/via contact, sidewall spacer (see 314A, 314B, 314C and 314D) etch and (b) via anneal. In one specific example, the etch is anisotropic (e.g., vertical (or substantially vertical) as shown up-down in this view). In another specific example, the via anneal is a high temperature anneal that is performed after the sidewall etch to repair the dielectric 307 and to remove any residue.

Figure 7:
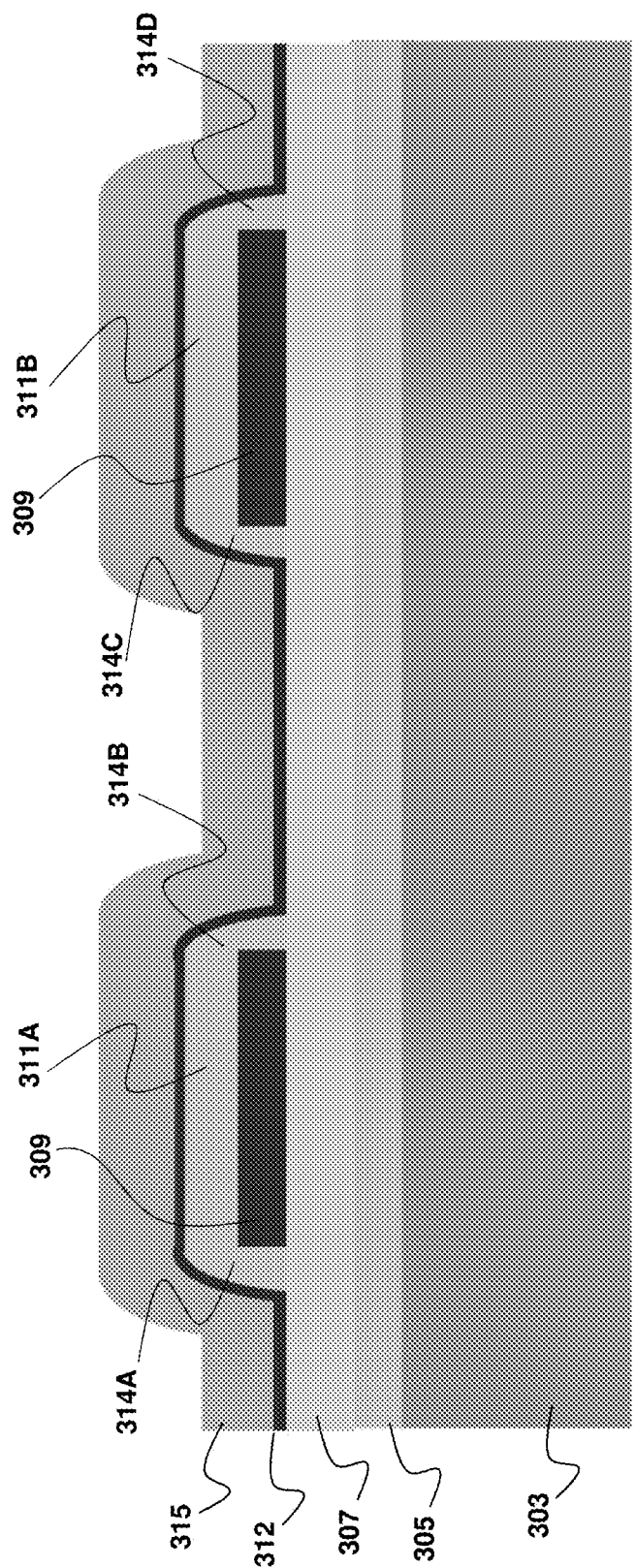
Figure 8:
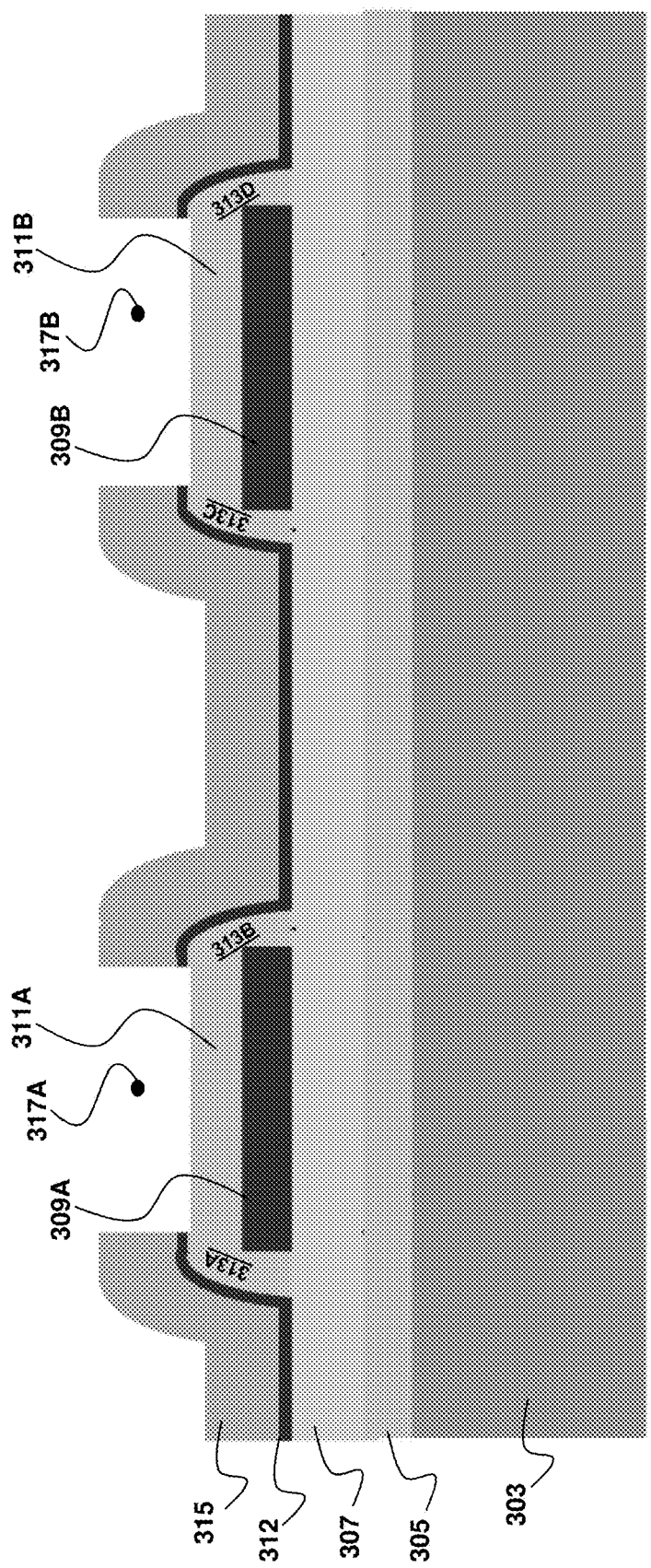

Further, FIG. 7 (related to platinum and M1 deposition) depicts production of an RF electrode resulting from: (a) deposition of platinum layer 312; and (b) deposition of M1 (metal) layer 315. In one specific example, the platinum layer can be a thin layer. In another specific example, the RF electrode can comprise the M1 metal layer (without the platinum layer 312). In another specific example, the M1 layer stack can comprise titanium-nitride (TiN), titanium, aluminum, TiN, gold, or any combination thereof. As used herein, the term "M1" can refer to "Metal 1," which is generally known as the first metal interconnect layer on an integrated circuit. In other examples, other M1 materials such as different alloys and layers may be used. In certain examples, the TiN functions as a barrier between the BST and the Al. Pt can be the metal of choice for the first layer of M1 for BST because of its high work function that gives the lowest leakage of all metals, though other elements such as Ir can be used as well. [0001] Further, FIG. 8 (related to M1/platinum (RF electrode) pattern/etch) depicts production of gaps 317A, 317B in the RF electrode by patterning/etching the M1 layer 315 and the platinum layer 312. In one specific example, the patterning/etching produces minimum Al lines/spaces.

Referring now to FIGS. 9A-9G, 10A-10G and 11A-11G, these depict an illustrative embodiment of various steps in the manufacturing of a coplanar capacitor (the views of FIGS. 9A-9G provide lateral cross-sections and these views include a resistor; the views of FIGS. 10A-10G provide cross-sections through a bias line; the views of FIGS. 11A-11G provide cross-sections through the RF electrode). In FIGS. 9A-9G, each call out number refers to the same respective component (as modified throughout the process). Further, in FIGS. 10A-10G, each call out number refers to the same respective component of FIGS. 9A-9G (as modified throughout the process). Further still, in FIGS. 11A-11G, each call out number refers to the same respective component of FIGS. 9A-9G (as modified throughout the process).

As seen in FIGS. 9A-9G, 10A-10G and 11A-11G, substrate 903 includes a thin silicon dioxide layer 905. A voltage-tunable dielectric layer 907 is disposed over the substrate, on the thin silicon dioxide layer. A plurality of bias lines (formed from metal layer 909) are disposed over the voltage-tunable dielectric layer. Further, the plurality of bias lines are covered by respective portions of an inter-level dielectric 911.

A plurality of sidewall spacers are provided. Each of the plurality of sidewall spacers is formed from an oxide layer 913 and is located adjacent one of the plurality of bias lines. Each of the plurality of sidewall spacers spans between a respective portion of the voltage-tunable dielectric layer and a respective portion of the inter-level dielectric such that the bias lines are fully enclosed in oxide. Further, an electrode 915 (e.g., an RF electrode) is provided over the inter-level dielectric (ILD), and over portions of the voltage-tunable dielectric layer that are not covered by the plurality of bias lines and that are not covered by the sidewall spacers. In one specific example, electrode 915 can include layer 912 (e.g. a thin platinum layer). A plurality of gaps are disposed in the electrode, wherein each of the plurality of gaps is located at a location above a respective one of the plurality of bias lines.

Figure 9A:
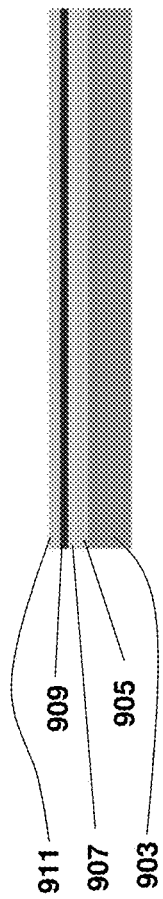
FIGS. 9A-9G depict an illustrative embodiment of various steps in the manufacturing of a coplanar capacitor (these views provide lateral cross-sections and these views include a resistor)
Figure 9B:
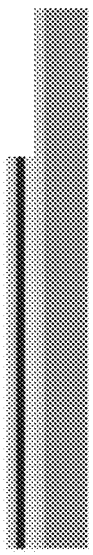
Figure 9C:
Figure 9D:
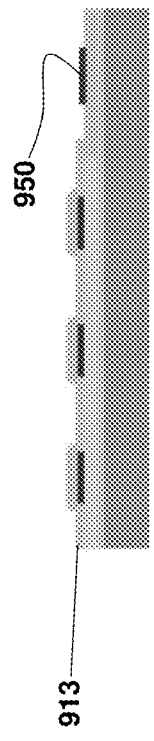
Figure 9E:
Figure 9F:
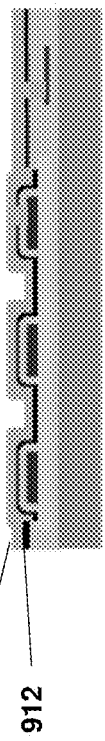
Figure 9G:
Figure 10A:
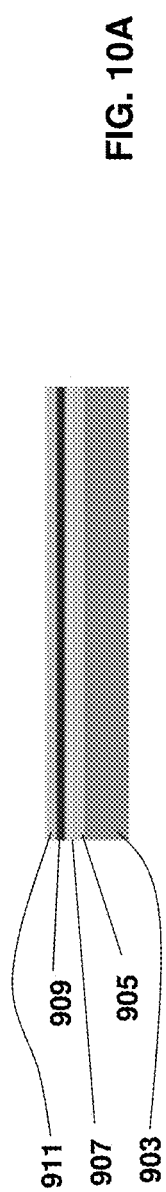
FIGS. 10A-10G depict an illustrative embodiment of various steps in the manufacturing of a coplanar capacitor (these views provide cross-sections through a bias line and these views correspond to respective views of FIGS. 9A-9G)
Figure 10B:
Figure 10C:
Figure 10D:
Figure 10E:
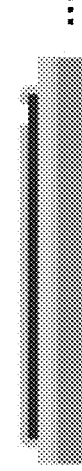
Figure 10F:
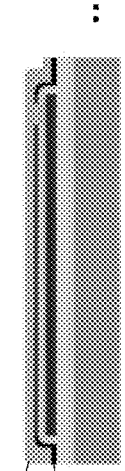
Figure 10G:
Figure 14:
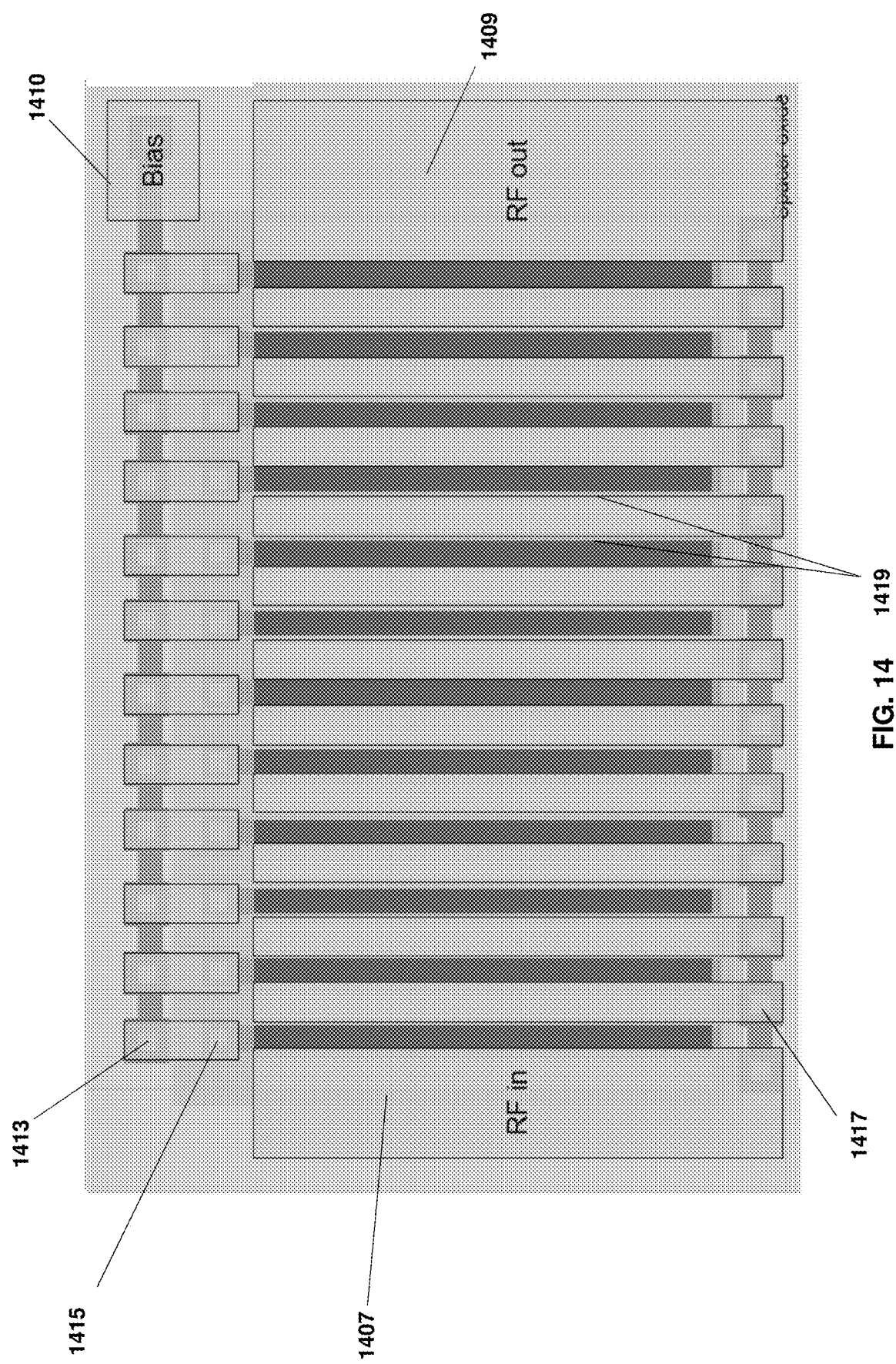
FIG. 14 depicts an illustrative embodiment related to manufacture of a coplanar capacitor (this FIG. 14 is a top-down view)

Referring now again to FIGS. 9A-9G, FIG. 9A relates to voltage-tunable dielectric/Pt bias line material/inter-level dielectric deposition; FIG. 9B relates to pattern/etch of the above stack (optional but useful). FIG. 9C relates to bias line pattern/etch: vertical sidewalls; FIG. 9D relates to resistor oxide deposition, SiCr dep/pattern/etch/anneal (see resistor 950—any desired number of which may be provided); FIG. 9E relates to spacer oxide deposition, spacer pattern/etch, Via pattern/etch; FIG. 9F relates to M1 stack deposition; and FIG. 9G relates to M1 pattern/etch. This shows the right-most bias line connected to the SiCr resistor by M1. This would happen at one end of each bias line as shown in FIG. 10G and FIG. 14. Each M1 RF electrode line would also be connected to a resistor at one end as shown in FIG. 14.

Referring now again to FIGS. 10A-10G, FIG. 10A relates to substrate preparation and BST/platinum/ILD deposition; FIG. 10B relates to BST patterning; FIG. 10C relates to bias line patterning and high-temperature anneal; FIG. 10D relates to resistor oxide deposition and SiCr deposition/anneal etch; FIG. 10E relates to spacer oxide deposition, SiCr contact etch, spacer/via etch (anisotropic) and via anneal; FIG. 10F relates to platinum/M1 deposition; and FIG. 10G relates to M1/platinum etch. Of note, FIGS. 10D-10G do not show the right-most portions of the device, with such deleted portions indicated in these FIGs. by three ellipses ( . . . ).

Referring now again to FIGS. 11A-11G, FIG. 11A relates to substrate preparation and BST/platinum/ILD deposition; FIG. 11B relates to BST patterning; FIG. 11C relates to bias line patterning and high-temperature anneal; FIG. 11D relates to resistor oxide deposition and SiCr deposition/anneal etch; FIG. 11E relates to spacer oxide deposition, SiCr contact etch, spacer/via etch (anisotropic) and via anneal; FIG. 11F relates to platinum/M1 deposition; and FIG. 11G relates to M1/platinum etch. Of note, FIGS. 11D-11G do not show the right-most portions of the device, with such deleted portions indicated in these FIGs. by three ellipses ( . . . ).

Figure 12:
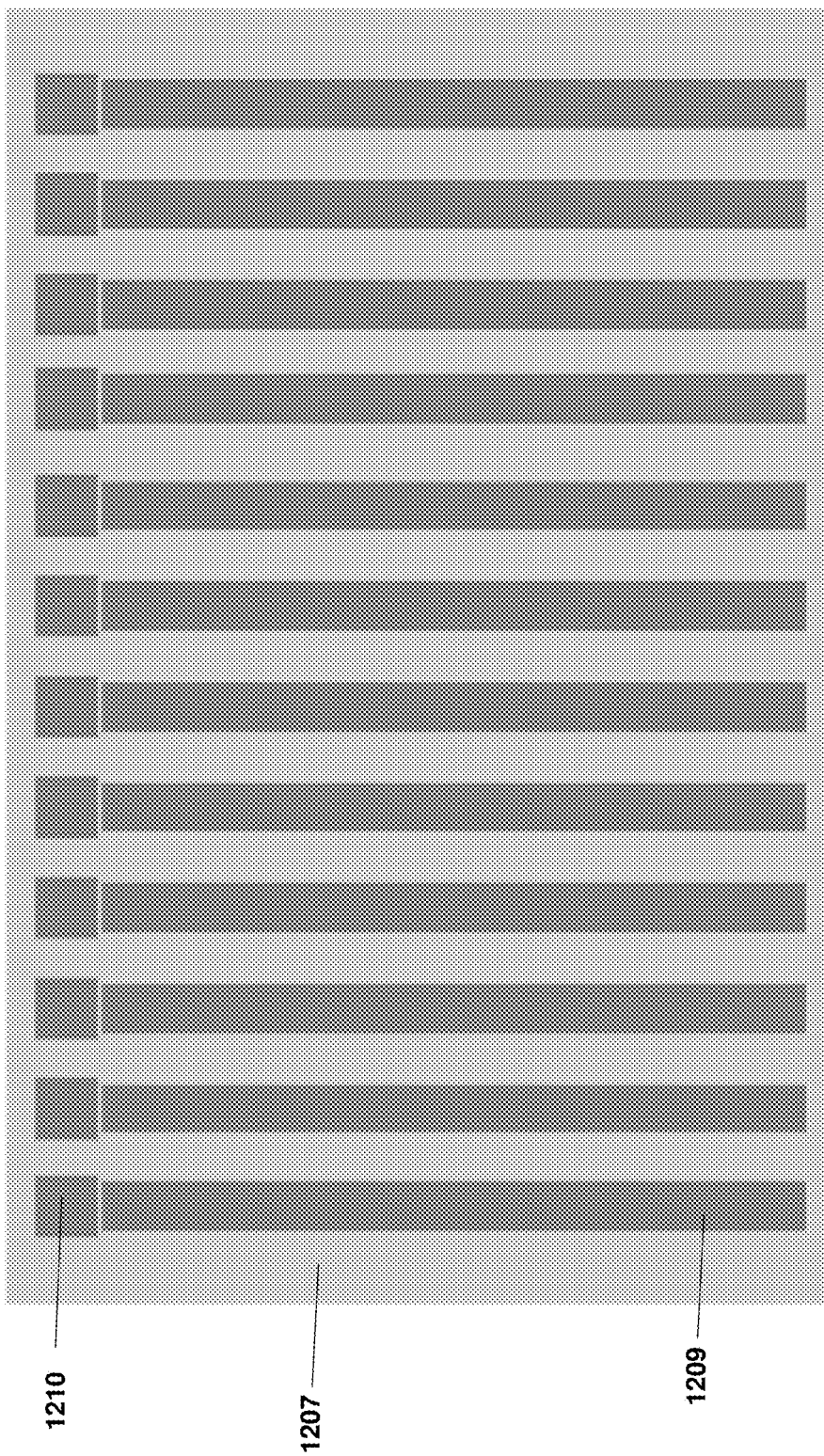
FIG. 12 depicts an illustrative embodiment related to manufacture of a coplanar capacitor at the stage of the process shown in FIG. 4 (this FIG. 12 is a top-down view)

Referring now to FIG. 12, this depicts an illustrative embodiment related to manufacture of a coplanar capacitor at the stage of the process shown in FIG. 4 (this FIG. 12 is a top-down view). This view is after a platinum/BST etch and after an ILD/platinum bias line etch. Shown in this FIG. 12 is voltage-tunable dielectric 1207, a plurality of bias lines (only one of which—1209 has a call out number), and a plurality of via pads (only one of which—1210 has a call out number).

Figure 13:
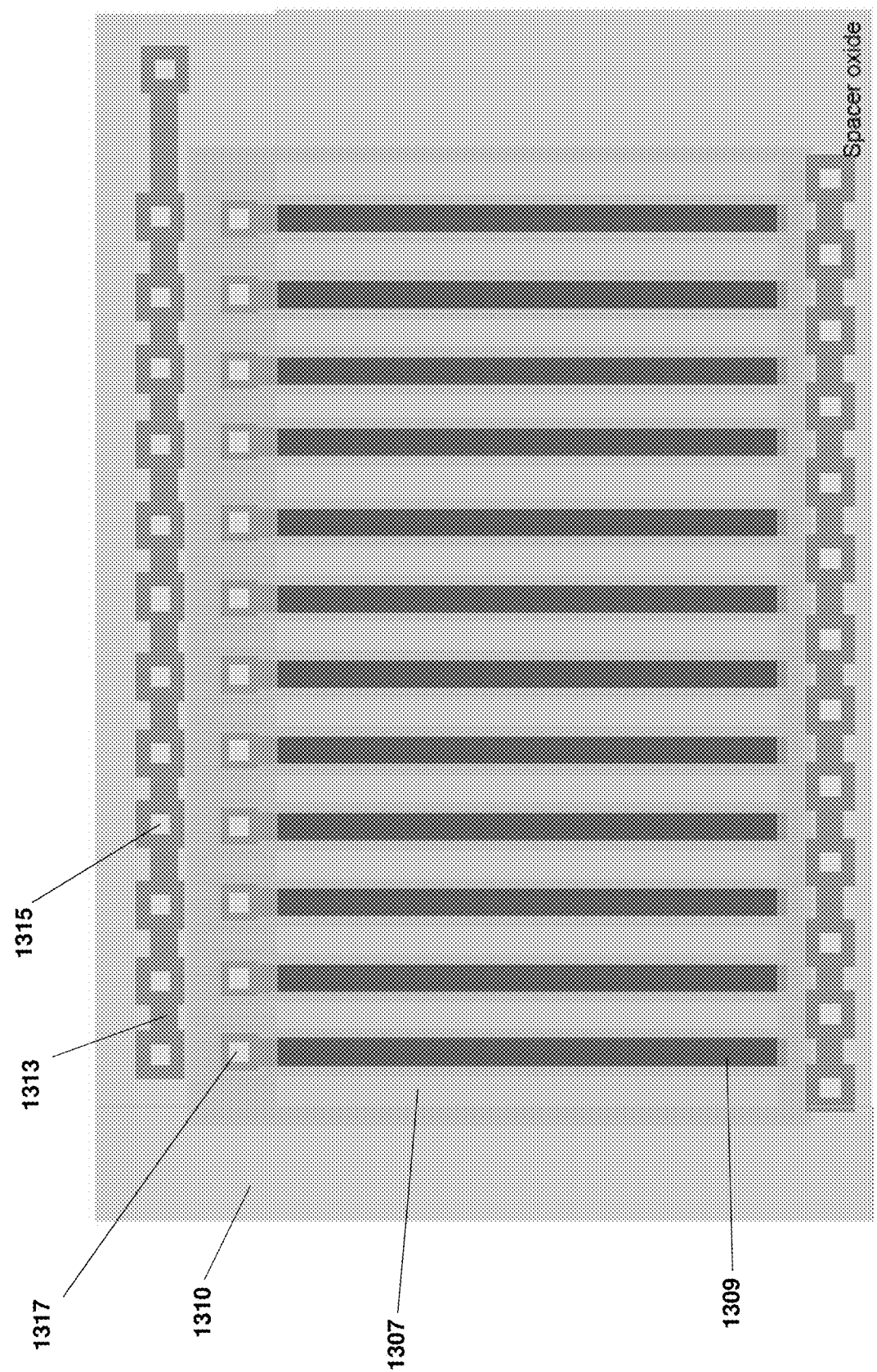
FIG. 13 depicts an illustrative embodiment related to manufacture of a coplanar capacitor (this FIG. 13 is a top-down view)

Referring now to FIG. 13, this depicts an illustrative embodiment related to manufacture of a coplanar capacitor (this FIG. 13 is a top-down view). This view is after resistor oxide deposition, SiCr processing, spacer oxide deposition, spacer etch and via processing. Shown in this FIG. 13 is the voltage-tunable dielectric 1307, a plurality of bias lines (only one of which—1309 has a call out number), spacer oxide 1310, SiCr resistors 1313, SiCr resistor contacts 1315, and bias line contacts 1317.

Referring now to FIG. 14, this depicts an illustrative embodiment related to manufacture of a coplanar capacitor (this FIG. 14 is a top-down view). This view is after M1 deposition/etch. Shown in this FIG. 14 is a location for RF input 1407, a location for RF output 1409, and a location for providing DC bias 1410. Also shown in this FIG. 14 are contacts between M1/SiCr (see, e.g., 1413), M1/bias line contacts (see, e.g., 1415), RF electrode/SiCr resistor contacts (see, e.g., 1417), and active capacitor areas under the spacers (see, e.g., active capacitor areas 1419 under M1 on the side of the bias lines).

Figure 15:
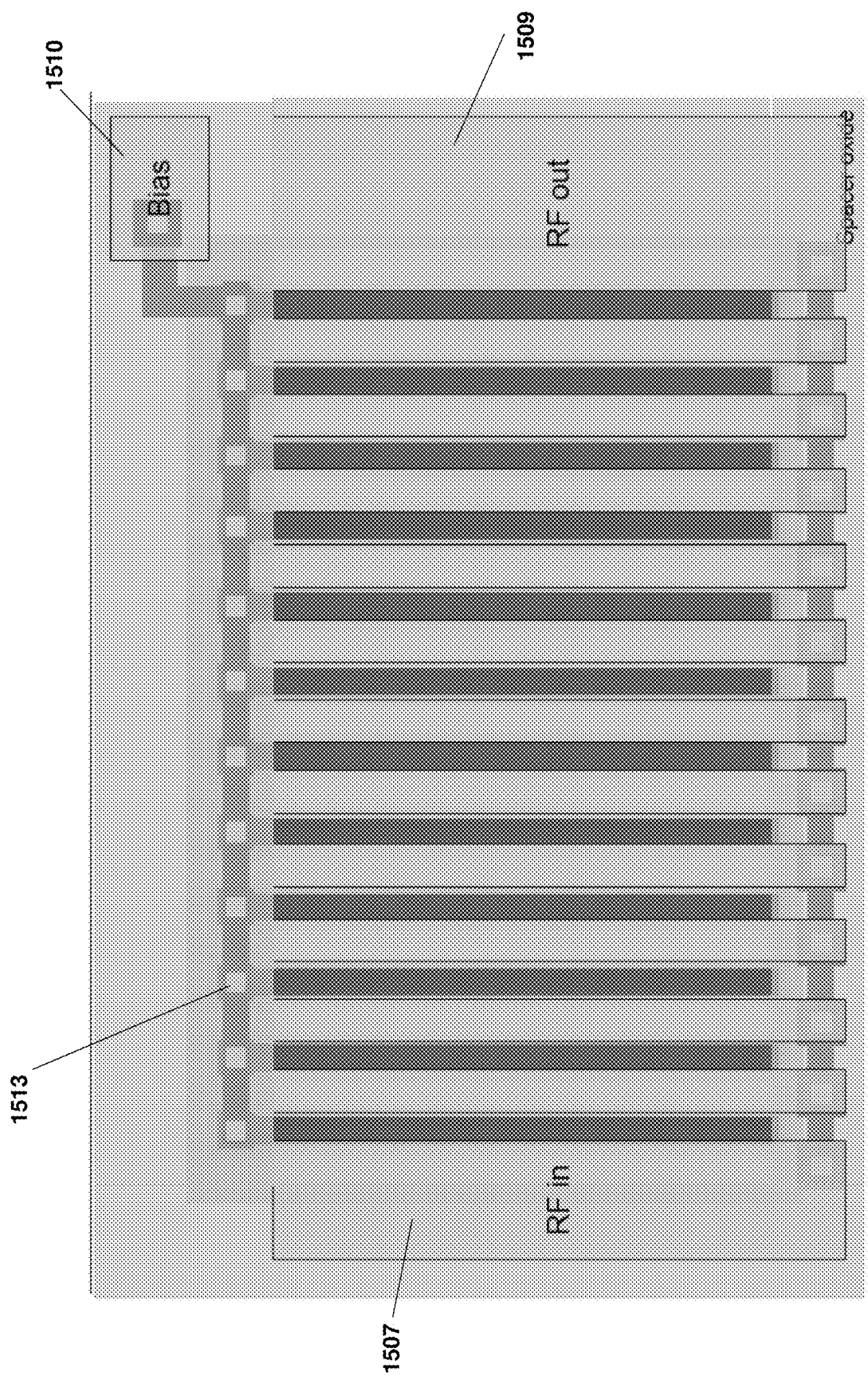
FIG. 15 depicts an illustrative embodiment related to manufacture of a coplanar capacitor (this FIG. 15 is a top-down view).

Referring now to FIG. 15, this depicts an illustrative embodiment related to manufacture of a coplanar capacitor (this FIG. 15 is a top-down view). This view is with SiCr directly contacting the platinum bias lines. Shown in this FIG. 15 is a location for RF input 1507, a location for RF output 1509, and a location for providing bias 1510. Also shown in this FIG. 15 are direct SiCr/Pt bias line contacts (see, e.g., 1513).

As described herein, various embodiments provide: (a) isolation of the RF electrode from the bias lines (using sidewall spacers); (b) definition of the active capacitor dielectric thickness (using sidewall spacers) and (c) passivation of the active (e.g., PARASCAN) capacitor dielectric (an unpassivated device may not be reliable and may fail in the field).

As described herein are embodiments of small-gap coplanar capacitors ("SGCC") constructed with sidewall spacers and metal layers (also described herein are embodiments of methods for manufacturing various coplanar capacitors). In one specific example, platinum (Pt) is used for all the contacts to the adjacent dielectric material (giving low leakage and a good interface). In another specific example, the M1 RF electrode and Pt bias line can be interchanged with the bias line having the thin Pt/TiN/Al and the RF electrode having the thick Pt and M1 on top. In another specific example, SiCr resistors can integrate easily into the technology. Such resistors may be needed to isolate the DC bias supply from the RF signal (as in a conventional Paratek Tunable Integrated Capacitors. In another specific example, the initial ILD (which can comprise, for example, silicon dioxide) can be necessary to isolate the bias line from the Pt/M1 RF electrode (or vice-versa). Without this isolation the spacer etch would, in certain manufacturing embodiments, expose the bias line Pt and short out the capacitor. In another specific example, sidewall spacers can be formed from structures with vertical edges covered with a conformal coating and etched using an anisotropic selective etch.

As described herein, in one specific example, a relatively thicker platinum layer can be used for the bias lines and a relatively thinner platinum and/or/M1 layer can be used only for the RF electrodes. In another example, the converse relative thicknesses can be provided.

As described herein, the bias line width can be an influence on Q-factor by introducing extra series resistance. In various embodiments, the design must guarantee that no voltage-tunable dielectric is exposed after the M1 patterning. Thus, in such embodiments, the bias line width is determined by the minimum M1 space and the M1/bias line alignment tolerance minus the spacer width. With good lithography and etch this could be, for example, less than 6 um (in this example, the length of the bias line could still be very high so there should be minimal impact on Q).

As described herein, resistor integration can include one or more of the following: (a) resistor oxide and spacer oxide are conformal; (b) etch the resistor and bias line vias (BLV's) together down to SiCr; BLV's will be only partially etched; (c) spacer etch will be patterned: leave oxide covering the edge of the BST and open the BLV's to platinum; leave resist on the SiCr contacts to protect against the spacer etch; the capacitor width is defined by the spacer oxide opening.

In another specific example, M1 can be used to seal all open BST after spacer etch. In another specific example, standard barrier/nitride/M2 or bump finish can be applied after M1 (as used in certain conventional processes). As used herein, the term "M2" can refer to the second layer of metal in a multi-layer interconnect technology. In another specific example, both low and high voltage capacitors can be provided in the same technology.

In another specific example, if the platinum makes a workable contact for the SiCr then the following simplifications can be provided: do the bias line via pattern/etch, SiCr deposition/anneal pattern, spacer oxide deposition, resistor contact pattern/etch, spacer pattern/etch (protecting the SiCr contacts), Pt/M1 deposition/etch.

As described herein, the process can use 7 masks: BST, Bias line, Resistor, Resistor/Bias line Via, Spacer, M1, Overcoat.

In other specific examples, the process can use 8 masks with M2, 9 masks with a pre-patterned lower electrode/BST mask for parallel-plate tunable capacitor integration. The lower electrode could also be used as another interconnect. In another specific example, the BST mask could be unnecessary (but its use could add a lot of flexibility in the device design—e.g., the chip could have co-planar waveguide (CPW) structures, nitride caps, etc.).

In another specific example, a patterned lower electrode could be done with another mask. The BST mask would then cut off the damaged BST at the edges of the electrode, allowing a parallel plate BST capacitor to be fabricated alongside the coplanar capacitor(s) with additional layers of BST (and masks) if required.

As described herein, the use of a sidewall spacer together with BST to define (without deep-submicron photolithography) a lateral capacitor width in the BST layer is provided. In one specific example, the BST can be PARASCAN and/or one or more other ferroelectric/polar/paraelectric tunable dielectrics.

As described herein is use of a sidewall spacer to separate a bias electrode from an RF electrode.

As described herein is use of a bias line between RF electrodes to bias lateral tunable capacitors with opposite polarities.

As described herein, the bias and RF electrodes can be formed from one or more of Pt, Al alloys, Al alloys combined with conductive barrier metals or alloys, gold, Ir, Ir oxides, SrRuO3, other conductive, resistive or semiconductive materials.

As described herein are use of the bias line width and RF electrode width to optimize the RF performance of the lateral capacitor (e.g., specifically optimize for electrostrictive resonance and third harmonic effects).

As described herein, variation of the spacer width to optimize the tuning voltage and breakdown voltage for different applications can be provided.

As described herein, integration of parallel-plate and coplanar BST capacitors in the same chip (e.g., with additional masks) can be provided.

As described herein, integration of parallel-plate and coplanar capacitors (e.g., using other dielectrics with the BST parallel-plate and coplanar capacitors) is provided. In various specific examples, the other dielectrics can include one or more of silicon nitride, silicon dioxide.

As described herein, integration of other microwave RF structures (such as coplanar waveguides, phase shifters, power splitters/combiners, mixers, etc.) together with the coplanar BST capacitors and/or parallel-plate capacitors can be provided.

In various embodiments, non-linear behavior of the capacitor can be minimized and/or harmonics that potentially limit the applications of the capacitor can be minimized. In various embodiments, capacitors can be provided that are useable at very high frequencies. In various embodiments, capacitors can be provided to cancel out effects such as electrostrictive resonance and third-order harmonics.

In various embodiments, a coplanar capacitor (with reasonable tuning voltage and usable capacitance) can be produced without requiring sophisticated and expensive photolithography.

In various embodiments, sidewall spacer technology can be used to create a narrow gap of tunable material (e.g. PARASCAN) in a coplanar structure. This can provide a low and controlled tuning voltage and higher capacitance (e.g., relative to other coplanar capacitor structures). In one specific example, various capacitor components are disposed laterally on a surface.

As described herein is a process of forming capacitors that are coplanar structures and that include sidewall spacers.

As described herein are capacitors and methods of making capacitors where sidewall spacers are formed to create a narrow gap of tunable dielectric material in a coplanar structure. The sidewall spacers can separate a bias electrode from an RF electrode.

Configurations according to various embodiments can give a low and controlled tuning voltage and higher capacitance relative to certain other coplanar capacitor structures.

As described herein, deposition of the resistor oxide and/or the spacer oxide can result in a conformal configuration.

In one embodiment, the device/method can require only one tunable dielectric and the capacitor dielectric can be electrically stacked to allow multiple capacitors in series (e.g., for cancellation of resonances and/or odd harmonics).

In one embodiment, the coplanar structure can allow different configurations of capacitors which can help reduce electrostrictive resonance and higher-level harmonic effects. In one specific example, the structure can also be integrated with coplanar waveguides and/or other thin-film microwave structures (e.g., to form compact integrated microwave circuits with good high frequency performance).

In one specific example, a resistor can be comprised of any thin film resistor material. In another specific example, a resistor can be comprised of polysilicon. In another specific example a resistor can be comprised of indium-tin-oxide (ITO). Other examples of thin film resistive materials are well-known to those ordinary skill in the art.

In one specific example, the ILD can isolate the M1 (e.g., metal, Al, Cu) from the bias lines.

In another specific example, a sufficiently thick ILD may permit a relatively thin bias line platinum layer.

In another specific example, use of platinum for the bias lines can keep the capacitor leakage low.

In another specific example, a resistor may connect to each bias line.

In another specific example, a resistive material (e.g., iridium tin oxide) can replace the platinum as the bias line material.

As described herein, a coplanar capacitor can be provided with components rigidly in a common plane (e.g., rigidly connected to a planar substrate). In one specific example, a coplanar capacitor can be provided such that there is essentially no flexing or bending provided or allowed between the components thereof.

In various embodiments, any desired voltage-tunable dielectrics may be utilized (e.g., not just PARASCAN or its derivatives (such derivatives being, for example, PARASCAN-like voltage tunable dielectrics)). In one specific example, un-doped BST may be utilized for the voltage-tunable dielectric.

In various embodiments, the electrodes (bias and/or RF) can comprise any desired and appropriate material or materials.

In various embodiments, the Pt/M1 is etched to give the RF electrodes and the interconnect lines for the device. In these embodiments, the gaps will define the width of the bias line because the bias line has to be slightly wider than the M1-M1 spacing to allow for mis-alignment. Elsewhere in the device the M1 connects the bias resistors to the bias lines and the RF electrodes connect to other resistors.

In another specific example, conformity (e.g., of the resistor and spacer oxides) can mean that they are laterally as thick on the vertical sidewalls as they are on the associated horizontal surfaces.

In various examples, the gaps in the RF electrode are not just over the bias lines, but the gaps can define the RF electrode shape and M1 lines.

In various examples, the M1/RF electrode layer is the interconnect for the device.

In various examples, metallization can be provided over the inter-level dielectric, field oxide and the exposed voltage-tunable dielectric layer, wherein the metallization forms: (a) RF electrodes; (b) interconnects between a resistive layer and the bias lines; and/or (c) DC bias/input/output pads for the device.

In one specific example, the RF electrode must cover all the exposed voltage-tunable dielectric. In another specific example, the RF electrode will overlap each bias line to a small extent.

As described herein, various devices can operate at a relatively high frequency (e.g., 2-6 GHz range).

In one specific example, the sidewall spacers can contribute to and/or define the active capacitor dielectric thickness.

In various examples, an electrode can be provided over the inter-level dielectric, and over portions of the voltage-tunable dielectric layer that are not covered by the plurality of bias lines and that are not covered by the sidewall spacers (wherein a plurality of gaps are disposed in the electrode, and wherein each of the plurality of gaps is located at a location at least partially above a respective one of the plurality of bias lines).

In another example, the voltage tunable material can be any voltage tunable dielectric. For example, it could be (but not limited to) Barium Strontium Titanate (BST), Barium Lanthanum Tantalate (BLT), Lead Titanate (PT), Lead Lanthanum Zirconate Titanate (PLZT), Strontium Bismuth Niobate (SBN), including the doped compositions or multi-layer structures thereof.

Upon reviewing the aforementioned embodiments, it would be evident to an artisan with ordinary skill in the art that said embodiments can be modified, reduced, or enhanced without departing from the scope of the claims described below.

Other embodiments can be applied to the subject disclosure without departing from the scope of the claims described below.

In another embodiment, the capacitors described herein can be applied in the context of tunable matching networks for cell phone handset antennas. In one specific example, the capacitors described herein can be applied to antenna impedance matching.

In another embodiment, equipment for carrying out processes described herein can be computer controlled in a series of steps to produce the structures described herein.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, are contemplated by the subject disclosure.

The components and techniques described in U.S. application Ser. No. 14/642,222 filed Mar. 9, 2015 and U.S.

application Ser. No. 15/184,081 filed Jun. 16, 2016 are hereby incorporated by reference herein in their entirety. These applications describe configurations and fabrication techniques, including particular deposition processes and parameters of those processes, that can be used with one or more of the exemplary embodiments described herein, including in addition to components or steps of the exemplary embodiments or in place of components or steps of the exemplary embodiments.

In one or more embodiments, a sputtering target can be selected or fabricated (and utilized in one or more of the exemplary embodiments) according to one or more of the features or process steps of U.S. Patent Publication No. 20140216921, the disclosure of which is hereby incorporated by reference.

One or more features and/or process steps described in U.S. Pat. Nos. 8,154,850, 8,693,162, 8,664,704, 5,745,335, U.S. Patent Publication No. 20140216921, and U.S. application Ser. No. 14/642,222 can be utilized in place of or in addition to one or more features and/or process steps described herein with respect to the exemplary embodiments. The disclosures of U.S. Pat. Nos. 8,154,850, 8,693,162, 8,664,704, 5,745,335, U.S. Patent Publication No. 20140216921, and U.S. application Ser. No. 14/642,222 are incorporated herein by reference in their entirety.

The Abstract of the Disclosure is provided with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A method for fabricating a coplanar capacitor, the method comprising:
depositing a voltage-tunable dielectric layer on a substrate;
depositing a metal layer on the voltage-tunable dielectric layer;
depositing an inter-level dielectric layer on the metal layer;
etching first material from the inter-level dielectric layer and second material from the metal layer to form a plurality of bias lines covered at least partially by respective portions of the inter-level dielectric layer;
depositing an oxide layer on exposed surface portions of the inter-level dielectric layer and on exposed surface portions of the voltage-tunable dielectric layer, wherein the oxide layer that is deposited includes upright portions between the inter-level dielectric layer and the voltage-tunable dielectric layer;
etching third material from the oxide layer to expose portions of the inter-level dielectric layer, to expose portions of the voltage-tunable dielectric layer and to form, from the upright portions, a plurality of sidewall spacers, wherein each of the plurality of sidewall spacers is located adjacent one of the plurality of bias lines, and wherein the etching of the third material from the oxide layer results in exposed portions of the inter-level dielectric layer and exposed portions of the voltage-tunable dielectric layer;
depositing a metallization layer on the exposed portions of the inter-level dielectric layer and on the exposed portions of the voltage-tunable dielectric layer; and
etching fourth material from the metallization layer to form a plurality of RF electrodes.

2. The method of claim 1, wherein the metallization layer further forms one or more interconnects between a resistive layer and one or more of the plurality of bias lines.

3. The method of claim 1, wherein the metallization layer further forms one or more of a DC bias pad, an input pad and an output pad.

4. The method of claim 1, wherein the etching the third material from the oxide layer comprises performing anisotropic etching.

5. The method of claim 4, wherein the anisotropic etching is in a direction perpendicular to the substrate.

6. The method of claim 1, wherein:
the substrate comprises a silicon dioxide layer; and
the voltage-tunable dielectric layer is over the silicon dioxide layer.

7. The method of claim 1, wherein:
the voltage-tunable dielectric layer comprises one or more of Barium Strontium Titanate (BST), Barium Lanthanum Tantalate (BLT), Lead Titanate (PT), Lead Lanthanum Zirconate Titanate (PLZT), Strontium Bismuth Niobate (SBN).

8. The method of claim 1, wherein:
the metal layer comprises one or more of platinum, iridium, ruthenium, osmium.

9. The method of claim 1, wherein the inter-level dielectric layer comprises silicon dioxide.

10. The method of claim 1, wherein each of the plurality of sidewall spacers comprises oxide.

11. The method of claim 1, wherein the metallization layer comprises a platinum layer.

12. The method of claim 11, wherein one or more other metal layers are formed on the platinum layer.

13. A method for fabricating a coplanar capacitor, the method comprising:
depositing a metal layer on a voltage-tunable dielectric layer;
depositing an inter-level dielectric layer on the metal layer;
etching first material from the inter-level dielectric layer and second material from the metal layer to form a plurality of bias lines covered at least partially by respective portions of the inter-level dielectric layer;
depositing an oxide layer on exposed surface portions of the inter-level dielectric layer and on exposed surface portions of the voltage-tunable dielectric layer, wherein the oxide layer that is deposited includes upright portions between the inter-level dielectric layer and the voltage-tunable dielectric layer;
etching third material from the oxide layer to expose portions of the inter-level dielectric layer, to expose portions of the voltage-tunable dielectric layer and to form, from the upright portions, a plurality of sidewall spacers, wherein each of the plurality of sidewall spacers is located adjacent one of the plurality of bias lines, and wherein the etching of the third material from the oxide layer results in exposed portions of the inter-level dielectric layer and exposed portions of the voltage-tunable dielectric layer;

depositing a metallization layer on the exposed portions of the inter-level dielectric layer and on the exposed portions of the voltage-tunable dielectric layer; and etching fourth material from the metallization layer to form a plurality of RF electrodes, the metallization layer further forming a DC bias pad, an input pad, an output pad, or any combination thereof.

14. The method of claim 13, further comprising depositing the voltage-tunable dielectric layer on a substrate prior to the depositing of the metal layer.

15. The method of claim 13, wherein the metallization layer further forms one or more interconnects between a resistive layer and one or more of the plurality of bias lines.

16. The method of claim 13, wherein the etching the third material from the oxide layer comprises performing anisotropic etching.

17. The method of claim 16, wherein the anisotropic etching is in a direction perpendicular to a substrate.

18. A method for fabricating a coplanar capacitor, the method comprising:

depositing a voltage-tunable dielectric layer on a substrate;

depositing a metal layer on the voltage-tunable dielectric layer;

depositing an inter-level dielectric layer on the metal layer;

etching first material from the inter-level dielectric layer and second material from the metal layer to form a plurality of bias lines covered at least partially by respective portions of the inter-level dielectric layer;

depositing an oxide layer on exposed surface portions of the inter-level dielectric layer and on exposed surface portions of the voltage-tunable dielectric layer, wherein the oxide layer that is deposited includes upright portions between the inter-level dielectric layer and the voltage-tunable dielectric layer;

etching third material from the oxide layer to expose portions of the inter-level dielectric layer, to expose portions of the voltage-tunable dielectric layer and to form, from the upright portions, a plurality of sidewall spacers, wherein each of the plurality of sidewall spacers is located adjacent one of the plurality of bias lines, and wherein the etching of the third material from the oxide layer results in exposed portions of the inter-level dielectric layer and exposed portions of the voltage-tunable dielectric layer; and etching fourth material from a metallization layer that had been deposited on the exposed portions of the inter-level dielectric layer and on the exposed portions of the voltage-tunable dielectric layer, the etching of the fourth material from the metallization layer forming a plurality of RF electrodes, the metallization layer further forming an interconnect between a resistive layer and one of the plurality of bias lines.

19. The method of claim 18, wherein:

the etching the third material from the oxide layer comprises performing anisotropic etching; and the anisotropic etching is in a direction perpendicular to the substrate.

20. The method of claim 18, wherein:

the substrate comprises a silicon dioxide layer; and the voltage-tunable dielectric layer is over the silicon dioxide layer.

* * * * *